United States Patent [19]

Barton

[11] Patent Number: 5,308,980
[45] Date of Patent: *May 3, 1994

[54] THERMAL MISMATCH ACCOMMODATED INFRARED DETECTOR HYBRID ARRAY

[75] Inventor: Jeffrey Barton, Goleta, Calif.

[73] Assignee: Amber Engineering, Inc., Goleta, Calif.

[*] Notice: The portion of the term of this patent subsequent to Nov. 23, 2010 has been disclaimed.

[21] Appl. No.: 928,955

[22] Filed: Aug. 11, 1992

Related U.S. Application Data

[63] Continuation-in-part of Ser. No. 658,985, Feb. 20, 1991, Pat. No. 5,264,699.

[51] Int. Cl.$^5$ .......................... G01J 5/20; H01L 27/14; H01L 31/18
[52] U.S. Cl. .................. 250/338.4; 250/332; 250/370.09; 250/370.13; 257/436; 257/442; 257/460; 257/469; 437/3; 437/5
[58] Field of Search ............... 250/338.4, 332, 370.09, 250/370.13; 257/436, 442, 469, 460; 437/3, 5

[56] References Cited

U.S. PATENT DOCUMENTS

| | | |
|---|---|---|
| H894 | 3/1991 | Halvis ........................ 437/3 |
| 3,577,631 | 5/1971 | Bylander et al. . |
| 3,794,883 | 2/1974 | Bylander et al. . |
| 3,900,865 | 8/1975 | Schaefer . |
| 4,374,678 | 2/1983 | Castro . |
| 4,411,732 | 10/1983 | Wotherspoon . |
| 4,779,004 | 10/1988 | Tew et al. . |
| 5,047,645 | 9/1991 | Gundjian et al. . |
| 5,075,201 | 12/1991 | Koh . |

Primary Examiner—Stephen C. Buczinski
Attorney, Agent, or Firm—Graham & James

[57] ABSTRACT

A hybrid infrared focal plane array detector employs a detector layer and transparent substrate bonded to a thin semiconductor readout integrated circuit and thicker readout circuit substrate. The readout circuit is rigidly bonded to the readout substrate to form a composite structure having a thermal coefficient of expansion substantially matching that of the detector portion. The hybrid device may be cooled from room temperature to cryogenic operation temperatures without thermal mismatch structural problems.

25 Claims, 13 Drawing Sheets

THERMAL MISMATCH ACCOMMODATED INFRARED DETECTOR HYBRID ARRAY

RELATED APPLICATION INFORMATION

The present application is a continuation-in-part application Ser. No. 07/658,985, filed Feb. 20, 1991, now U.S. Pat. No. 5,264,699.

BACKGROUND OF THE INVENTION

1. Field of the Invention

The present invention relates to infrared detector hybrid arrays. More particularly, the present invention relates to infrared detector hybrid arrays including an infrared detector array mounted on a readout circuit.

2. Description of the Prior Art and Related Information

Infrared detection systems are of significant technological importance for both military and civilian space based and terrestrial monitoring applications. High performance infrared detection systems, typically referred to as infrared focal plane arrays, employ an infrared detector array coupled to a readout circuit. In so-called "backside illuminated" systems, a hybrid detector/readout structure is formed by mounting the detector on top of the readout chip. The detector may typically employ a thin layer of detector material, chosen for sensitivity to the infrared frequency range to be monitored, formed on a suitable substrate transparent to infrared radiation in the frequency range desired. An array of photodetectors is formed in the thin layer of detector material. This detector array is then directly mounted on a readout circuit which is typically a conventional silicon integrated circuit having the necessary circuitry for picking up the signals detected by the detector array, amplifying them and processing them for the specific monitoring application.

Figure 1:
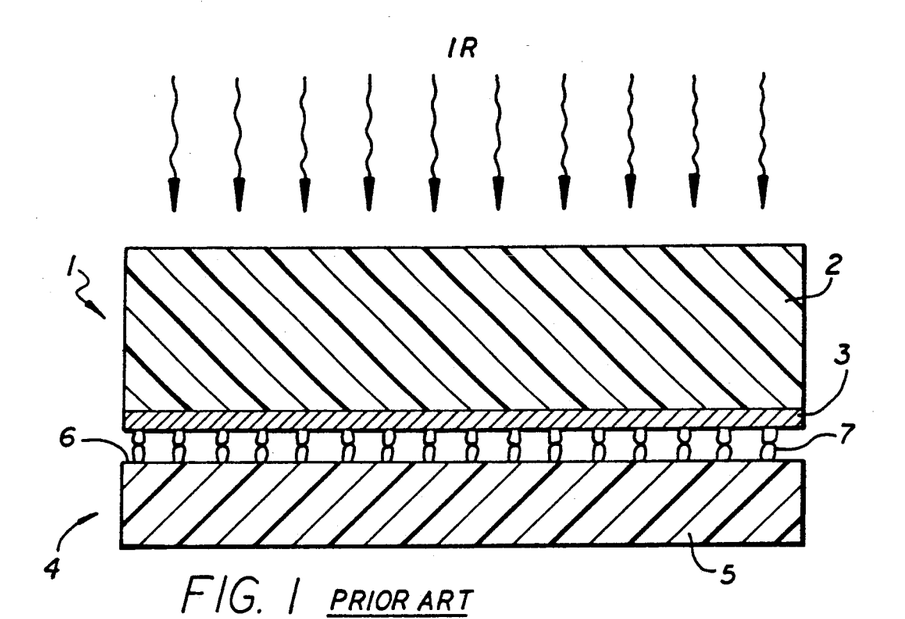
FIG. 1 is a cross-sectional view of a prior art hybrid infrared focal plane array.

Referring to FIG. 1, a conventional prior art hybrid infrared detector array is illustrated in cross-section. The conventional hybrid array includes a monolithic detector array 1 which includes, for example, a cadmium-telluride (CdTe) substrate 2 with a relatively thin active infrared detection layer 3 of HgCdTe on one major surface thereof. As shown, the IR radiation to be detected enters the detector through the IR transparent substrate. The infrared detector array 1 is "bump-bonded" to a readout circuit 4. The readout circuit 4 will typically be manufactured using conventional integrated circuit semiconductor processing technology and will thus have a silicon substrate 5 with the desired readout circuit formed on the upper surface 6 thereof. The conventional "bump-bonding" technique employs indium interconnects 7. These indium bumps 7 provide both the electrical interconnects between the infrared detector array 1 and the silicon readout circuit 4, as well as providing mechanical bonding between the detector array 1 and readout circuit 4. An epoxy bonding material (not shown) is also commonly employed to further bond the detector array 1 and readout circuit 4.

The indium bump bonded hybrid detector array, such as illustrated in FIG. 1, has the advantage that relatively large two-dimensional arrays may be fabricated. Additionally, the indium bump bonding technique provides low resistance and low capacitance interconnection between the detector 1 and the readout circuit 4.

Figure 2:
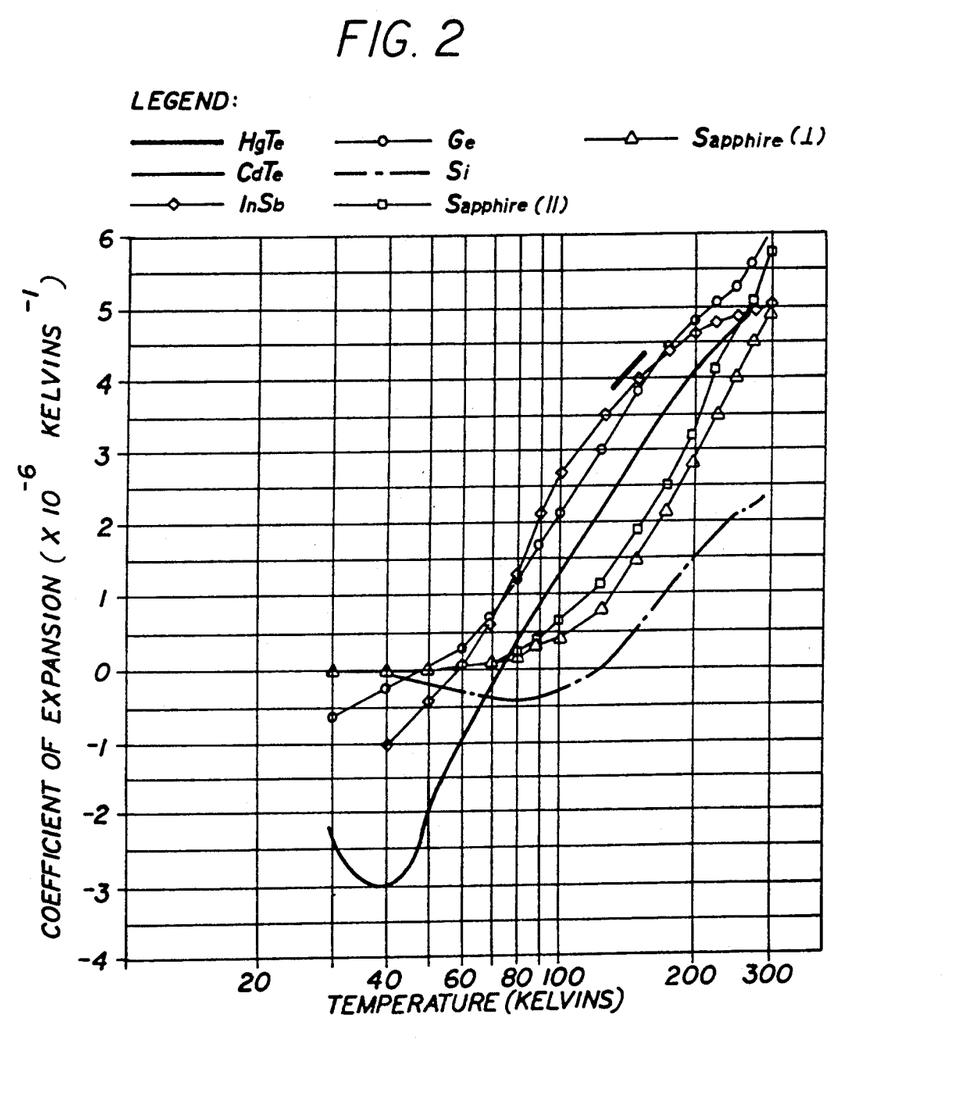
FIG. 2 is a chart illustrating the thermal coefficients of expansion for several materials employed in hybrid infrared focal plane arrays through the temperature range of 30° K.–300° K.

One significant disadvantage of the prior art infrared detector array of FIG. 1, however, is the lack of reliability introduced by virtue of the difference in the temperature coefficient of thermal expansion between the detector array 1 and the readout circuit 4. The hybrids are manufactured at room temperature under zero stress but operated at very low temperatures, typically less than 100° K. As a result, considerable stress is introduced at the junction of the detector 1 and the readout circuit 4 due to the thermal mismatch. The significance of this problem may be appreciated by comparing the coefficients of expansion of various materials potentially involved in such hybrids through the temperature range of 30°-300° K., as illustrated in FIG. 2. As will be appreciated from FIG. 2, a significant difference in the coefficient of expansion exists between silicon, HgTe and CdTe throughout most of this temperature range.

In practice, the thermal mismatch problem manifests itself as either physical damage in the hybrid array or degraded performance. The physical damage may manifest itself as either local or global delamination of the hybrid, i.e., actual separation of the indium bumps between the detector and readout circuit, or cracking of the detector array. The performance degradation may manifest itself as lack of uniformity between arrays, within an array, or as a general reduction in performance specifications. Additionally, the magnitude of the thermal mismatch problem is directly proportional to the size of the array. For example, for arrays of one inch by one inch, more than 17 microns of mismatch exists between the silicon readout circuit and a HgCdTe detector array after cooling from room temperature to a cryogenic temperature of about 77° K. As a result, in practice the size of practical hybrid arrays have been limited to about 0.25 inches by 0.25 inches by the thermal mismatch and associated reliability problems. This limitation in size has occurred despite the key advantage of large arrays for infrared detection sensitivity and spatial resolution capability.

Several methods have been employed in the prior art to attempt to overcome the thermal mismatch problem and allow increased size detector arrays. One such approach has been to employ taller indium bumps 7, the taller bumps allowing some lateral bending of the bumps to accommodate the thermal mismatch before delamination or cracking occurs. Although this approach can provide some reduction in the thermal mismatch problem for smaller arrays, it is inherently limited in its application to larger arrays, for example, much greater than about 0.3 inches by 0.2 inches. Also, where the hybrid array is required to be back filled with epoxy to provide adequate bonding between the detector array and the readout circuit, the use of taller indium bumps is not a viable solution. Furthermore, such approach has not proven to be viable in applications requiring long term reliability, having multiple thermal cycles, and/or high G force environments.

In another approach, the thermal mismatch problem has been reduced somewhat by the deletion of the epoxy used to bond the detector array and silicon readout circuit together. In particular, some improvement is provided when this is combined with taller indium bumps to allow the bumps to flex somewhat to accommodate the thermal mismatch. Although this approach may be suitable for laboratory demonstrations of hybrid arrays, it is not useful for most practical applications. Since the epoxy is not present to strengthen the bond between the array and readout circuit, the resultant hybrid is quite susceptible to delamination because only the indium bonds provide the bonding. Therefore, the stress introduced during handling and assembly, and in space based applications, where high G forces and/or high vibration will be present, makes this approach unsuitable in practice.

Another approach to solving the thermal mismatch problem has been to employ a substrate which has a closer thermal coefficient of expansion to silicon as the substrate for the infrared detector active layer. For example, sapphire has been employed as a substrate for HgCdTe epitaxial detector layers to provide an improved thermal match with the silicon readout circuit. As may be appreciated from FIG. 2, sapphire has a much closer coefficient of expansion to silicon than does CdTe, the more common detector substrate. Nonetheless, some mismatch in the coefficient of expansion does exist between sapphire and silicon, leading to at most a reduction, not an elimination of the thermal mismatch problem. Also, the use of a sapphire substrate for the detector array has resulted in reduced detection performance levels. As a result, the use of alternate substrates for the detector array has not proven to be an adequate solution to the thermal mismatch problem.

Accordingly, none of the existing approaches to reducing or eliminating the thermal mismatch problem are suitable for solving the problem in applications involving desired large arrays in applications such as space based monitoring where large G forces and high vibration will be present. Accordingly, a need presently exists to provide a solution to the thermal mismatch problem in a manner which is practical for such desired applications.

SUMMARY OF THE INVENTION

The present invention provides an improved infrared detector hybrid array having significantly reduced susceptibility to the problems associated with thermal mismatch between the detector array portion and the silicon readout circuit.

Additionally, the present invention provides a method for manufacturing such an improved, thermal mismatch resistant, detector hybrid array in a manner which is readily compatible with existing manufacturing techniques.

The present invention provides a hybrid infrared detector employing a thin readout integrated circuit "sandwiched" between the detector array portion and a readout substrate. The readout circuit is rigidly bonded to the readout substrate to form a composite structure with a coefficient of thermal expansion intermediate between that of the readout circuit and the readout circuit substrate. By thinning the readout circuit, the coefficient of thermal expansion of this composite structure may approach that of the readout substrate and the readout substrate, in turn, is composed of a material having a coefficient thermal expansion relatively close to that of the detector array portion. Alternatively, a thicker readout circuit may be employed with a substrate having a coefficient of thermal expansion substantially greater than that of the detector portion so that the intermediate coefficient of thermal expansion of the composite structure approximates that of the detector array portion. The detector array portion may be conventional, having a thin active detector layer formed on an infrared transparent detector substrate, adapted for backside illumination of the active layer.

In a preferred embodiment, an active infrared detector layer of mercury-cadium-telluride (HgCdTe) is provided on a transparent substrate of cadmium-telluride (CdTe). The readout circuit is preferably a silicon integrated circuit which may be conventional other than its thickness, which is preferably 1-20 mils. The readout substrate is chosen to provide a readout/substrate composite coefficient of thermal expansion approximately equal to that of the HgCdTe detector array portion. Any of a number of suitably chosen substrate materials may be employed; for example, alumina, berrylia, sapphire, iron/nickel alloy or stainless steel may be employed with the thickness of the readout circuit and readout substrate being chosen to result in a composite structure having the desired coefficient of thermal expansion. The HgCdTe/CdTe detector array portion is bonded to the silicon readout circuit/readout substrate composite in a conventional manner, employing an indium bump bonding interconnection and an epoxy back-fill to securely bond the two substrates.

The present invention further provides a method for manufacturing an infrared hybrid detector array having improved resistance to thermal mismatch problems, in a manner readily compatible with conventional manufacturing techniques. In a preferred embodiment, the infrared detector array portion of the hybrid is fabricated in a conventional manner, as is the silicon readout circuit. For example, the active infrared detection layer may be epitaxially grown on a transparent substrate to form a HgCdTe/CdTe detector. The readout portion of the hybrid array in turn is fabricated using conventional integrated circuit manufacturing techniques. The readout integrated circuit is then thinned, via lapping, diamond turning, laser thinning, chemical etching, or polishing techniques, to a desired thickness, preferably 1-20 mils. The thinned readout IC is then rigidly bonded to the readout substrate. The detector array portion is then indium bump bonded to the silicon readout chip/readout substrate composite. An epoxy backfill may also be employed to further increase the bonding of the detector array portion and readout composite.

Accordingly, it will be appreciated that the present invention provides an improved infrared hybrid detector array having significantly reduced susceptibility to thermal mismatch problems. It will be further appreciated that the present invention provides the capability to produce larger infrared hybrid detector arrays with an associated increase in the performance characteristics of such larger arrays. It will be further appreciated that the present invention provides such improvements without requiring a significant increase in processing steps and without requiring any new processing technology.

Further features and advantages of the present invention will be appreciated by those of ordinary skill in the art by review of the following detailed description of the invention.

BRIEF DESCRIPTION OF THE DRAWINGS

FIG. 3($a$) is a perspective view and FIG. 3($b$) is an exploded view, of an improved hybrid focal plane array in accordance with the present invention.

DETAILED DESCRIPTION OF THE INVENTION

Figure 3A:
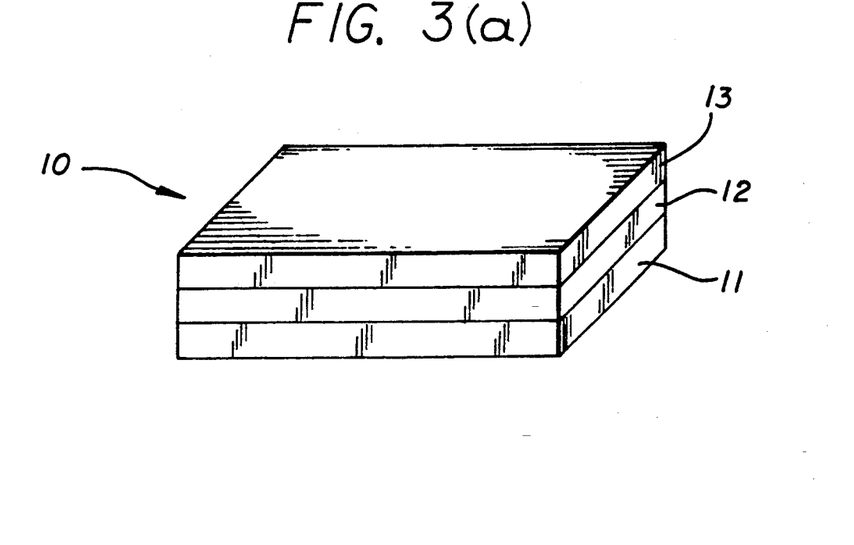
Figure 3B:
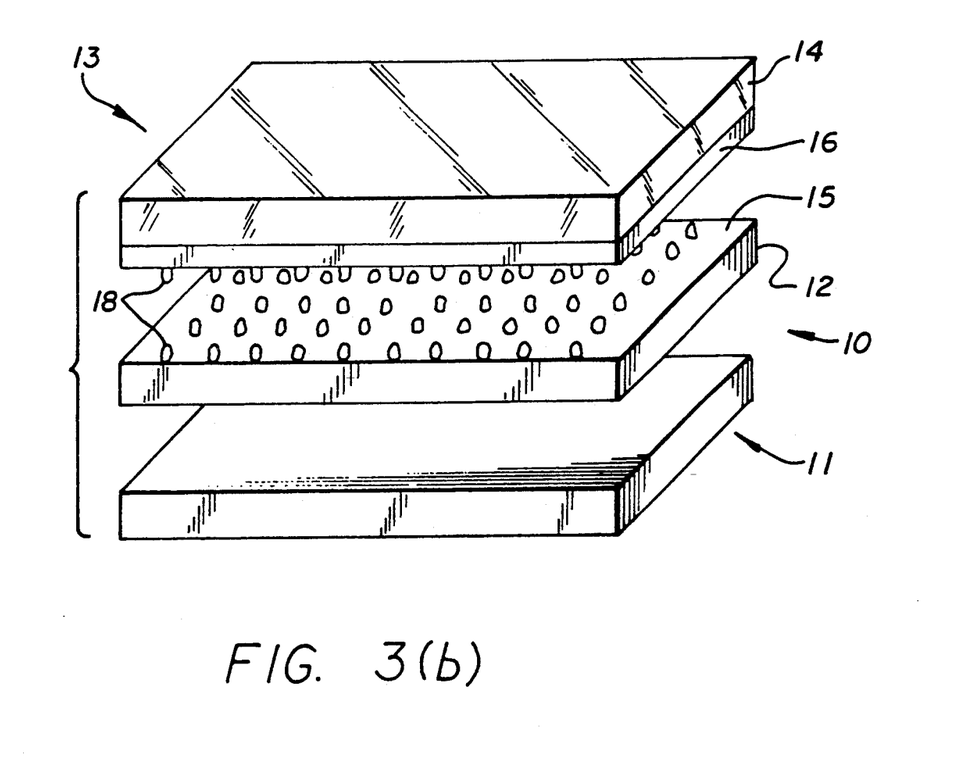

Referring to FIGS. 3(a) and 3(b), a preferred embodiment of the hybrid infrared detector of the present invention is illustrated in a perspective/cross-sectional view and an exploded view, respectively.

As illustrated in FIGS. 3(a) and 3(b), the hybrid infrared detector 10 of the present invention employs a three piece "sandwich" structure. More specifically, the hybrid sandwich structure includes a thin readout circuit 12 sandwiched between a detector array portion 13 and a readout substrate 11. Readout circuit 12 will preferably be formed as an integrated circuit on upper major surface 15 of silicon readout chip 12. The specific circuitry employed in the readout circuit 12 may be completely conventional in nature, and varies with the specific application. Accordingly, details of its specific construction will be omitted herein. It will be appreciated, however, that other types of readout IC materials may also be employed other than silicon; for example, gallium-arsenide ICs may be employed, such circuits also suffering from the thermal mismatch problem in conventional hybrid focal plane arrays, but to a somewhat lesser extent.

The infrared detector portion 13, as illustrated in FIG. 3(b), employs a transparent substrate 14 and a thin active infrared detection layer 16 formed into an array of active photodiodes (not shown). The active infrared detection layer 16 and the photodiodes formed therein may be conventional in nature. In a preferred embodiment, the transparent substrate 14 may be composed of cadmium-telluride (CdTe) with the active infrared detection layer 16 being an epitaxial layer of mercury-cadmium-telluride (HgCdTe). It will be appreciated, however, that other well known materials may also be employed for the transparent substrate 14 and active layer 16; for example, a suitable combination of substrate 14 and active layer 16 may include any combination of Zn, Cd or Hg with any combination of Te or Se. Also an InSb active layer may be employed. The ratio of the various constituents forming the active layer and the substrate are chosen to obtain the required properties. For example, a HgZnTe active layer may be grown on a CdSeTe substrate with similar properties to HgCdTe grown on CdTe if the ratio of the constituents are properly chosen according to known guidelines. The specific materials (or ratio of constituents) selected will depend upon the frequency of infrared radiation desired to be detected for the specific application of the hybrid infrared focal plane array. The infrared detector portion is bonded to the upper surface 15 of silicon readout circuit 12 through indium bump interconnects 18 and an epoxy bonding material (not shown).

Figure 4:
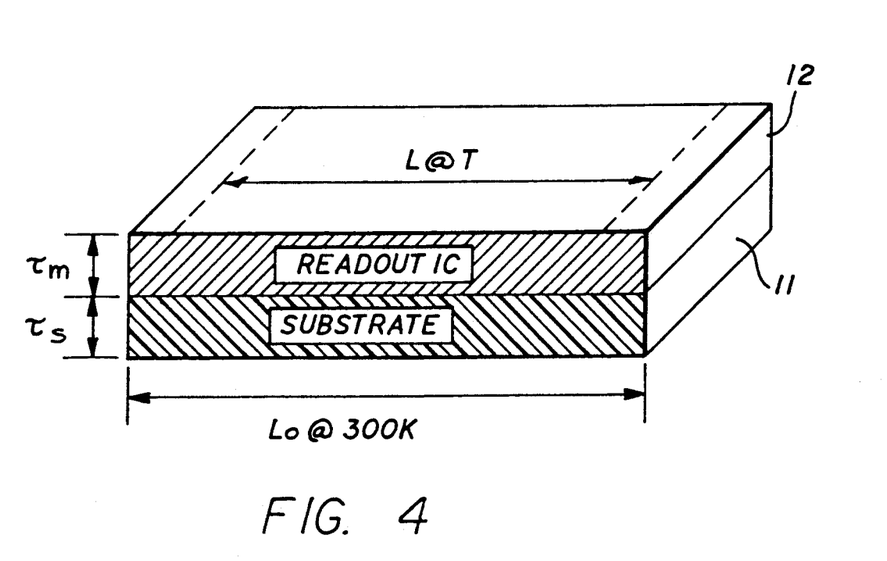
FIG. 4 is a drawing illustrating the readout circuit/substrate composite employed in the hybrid detector of the present invention.

As illustrated in FIG. 4, (although FIG. 4 is not drawn to scale), the silicon readout circuit 12 has a thickness $\tau_m$, while the readout substrate 11 has a thickness $\tau_s$. In the hybrid detector array of the present invention, the readout circuit 12 thickness $\tau_m$ is thinner than that of a conventional silicon readout circuit; for example, in the range of 1–20 mils, whereas conventional readout circuits are 25–35 mils thick or greater.

The thickness $\tau_m$ of the readout circuit 12 is chosen to achieve a desired coefficient of thermal expansion for the readout/substrate composite, which is approximately equal to that of the detector array portion 13 for a given substrate material and substrate thickness $\tau_s$. The necessary $\tau_m$ may be approximately obtained through a relatively simple calculation. More specifically, assuming a one-dimensional analysis along the length direction L in FIG. 4, the readout IC 12 thermal properties are characterized by its thickness $\tau_m$; Youngs modulus $Y_m$; and thermal expansion coefficient $\alpha_m$. Similarly, the thermal properties of the substrate 11 are characterized by its $\tau_s$, $Y_s$, and $\alpha_s$. The readout IC 12 is glued to the substrate 11 at room temperature (300° K.) and both are assumed to have linear dimension $L_0$ at 300° K. and dimension L when cooled to temperature T. Then:

$$L = L_0(1 - \alpha_s \delta T + (\delta \xi / \delta \chi)_s) \qquad (1)$$

and $$L = L_0(1 - \alpha_m \delta T + (\delta \xi / \delta \chi)_m) \qquad (2)$$

where $\delta T = 300 - T$, and $(\delta \xi / \delta \chi)_{s,m}$ is the deviation of L from the equilibrium value for each material when cooled alone. The above two equations in three unknowns may be solved with the additional relationship that the forces associated with the strain, $(\delta \xi / \delta \chi)_{s,m}$ are equal for both materials. That is $$S_s Y_s (\delta \xi / \delta \chi)_s = S_m Y_m (\delta \xi / \delta \chi)_m$$

where $S_{s,m}$ are the areas of the readout IC and substrate edges, that is $S_s = \tau_s L$.

After some manipulation it may be shown that $$L/L_0 = \frac{1 - \alpha_s \delta T + (\tau_m Y_m / \tau_s Y_s)(1 - \alpha_m \delta T)}{1 + \tau_m Y_m / \tau_s Y_s} \qquad (3)$$

Defining $(\delta L/L_0)_{eff}$ as the fractional change in dimension of the readout chip when it is rigidly fixed to a substrate and cooled from room temperature to temperature T, $$(\delta L/L_0)_{eff} = (L - L_0)/L_0 = \qquad (4)$$

$$\frac{-(\delta L_s/L_0)_{free} - (\tau_m Y_m / \tau_s Y_s)(\delta L_m/L_0)_{free}}{1 + \tau_m Y_m / \tau_s Y_s}$$

where $$(\delta L_{s,m}/L_0)_{free} = \int \alpha_{s,m}(T)dT \quad (5)$$

is the fractional change in dimension of the silicon and the substrate when cooled alone. When $(\delta L/L_0)_{eff} = (\delta L/L_0)_{detector}$, the thermal mismatch and associated hybrid unreliability are eliminated.

Figure 5A:
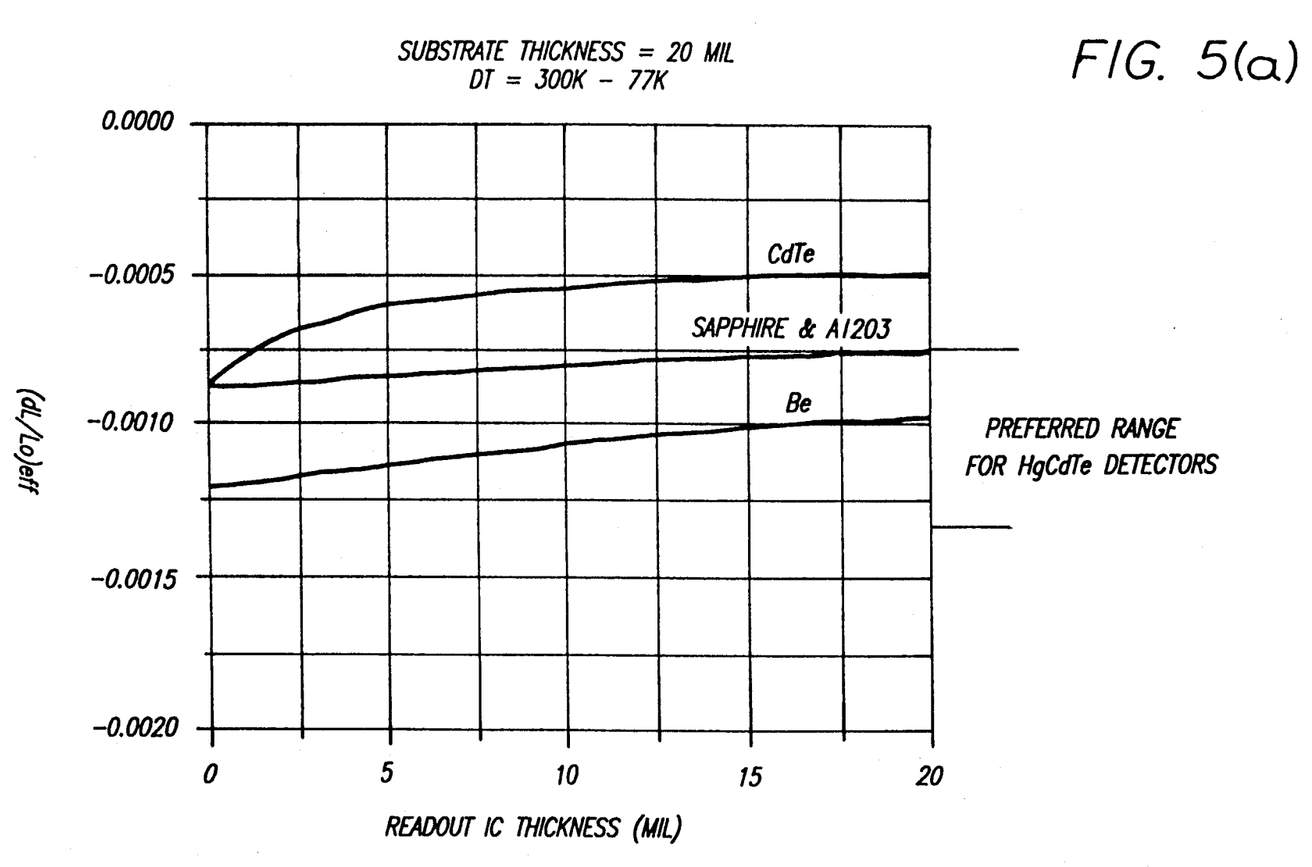
FIGS. 5(a) and 5(b) are graphs illustrating, for two difference scale sizes, the relationship between silicon readout circuit thickness and coefficient of thermal expansion of a readout circuit/substrate composite for various substrates of 20 mil thickness.
Figure 5B:
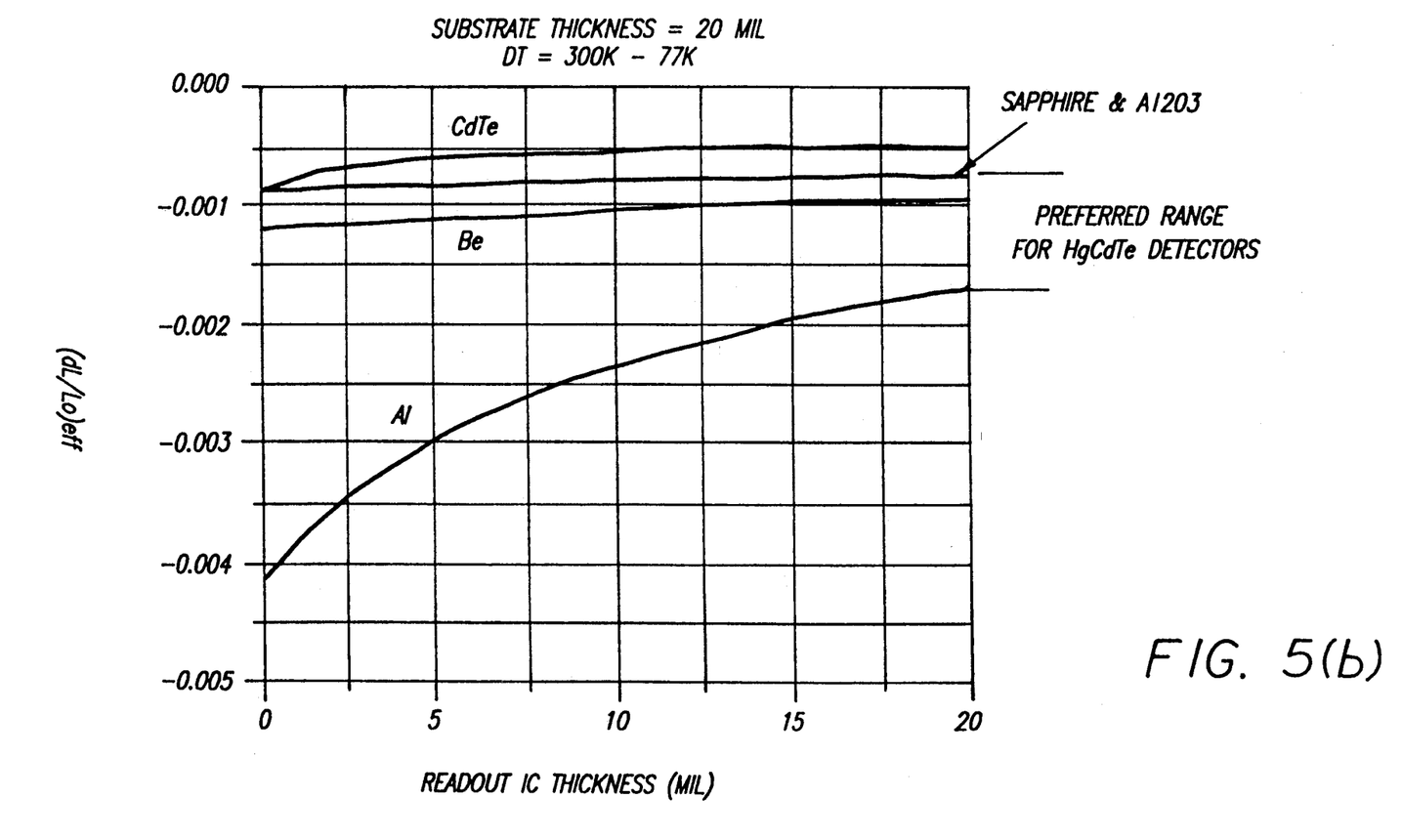

FIG. 5 is a plot of $(\delta L/L_0)$eff for $\delta T = 300 - 77K$ for several substrate materials with a thickness of 20 mil as a function of silicon thickness. For example, to match a silicon readout IC to the thermal expansion of a HgCdTe detector portion it is desired to obtain $(\delta L/L_0)_{eff} = (\delta L/L_0)_{detector} = -0.001$. Examination of FIG. 5 indicates that a readout circuit of 15 mil thickness rigidly fixed to a beryllium substrate of 20 mil thickness will exhibit a thermal expansion equal to HgCdTe. A broad range of $(\delta L/L_0)_{eff}$ may be obtained depending upon the choice of substrate material and silicon thickness. With the examples shown in FIG. 5 it is possible to match detector materials with $-0.004 < (\delta L/L_0)_{detector} < -0.0005$.

Figure 6A:
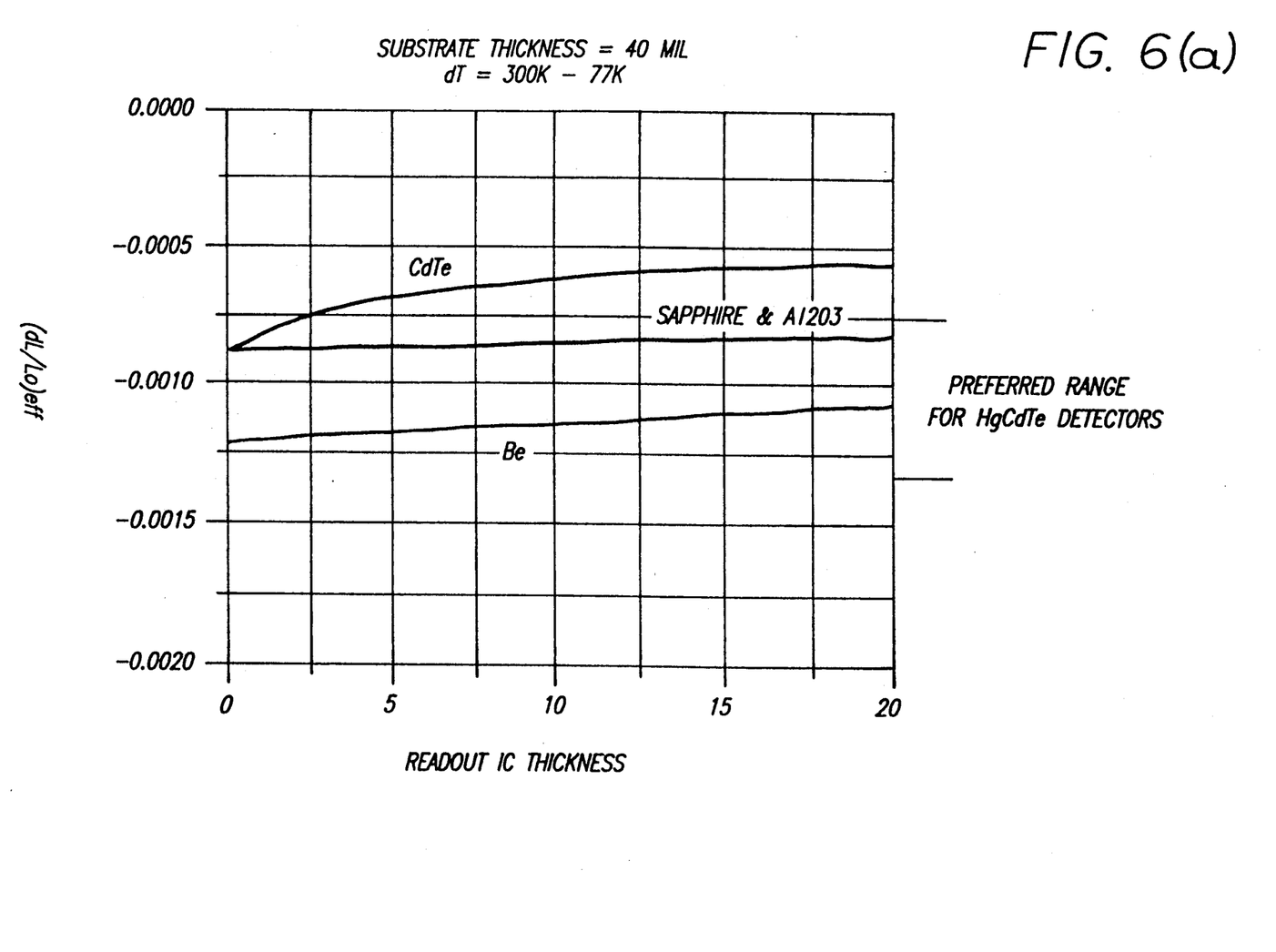
FIGS. 6(a) and 6(b) are graphs, corresponding to FIG. 5, for a substrate thickness of 40 mil.
Figure 6B:
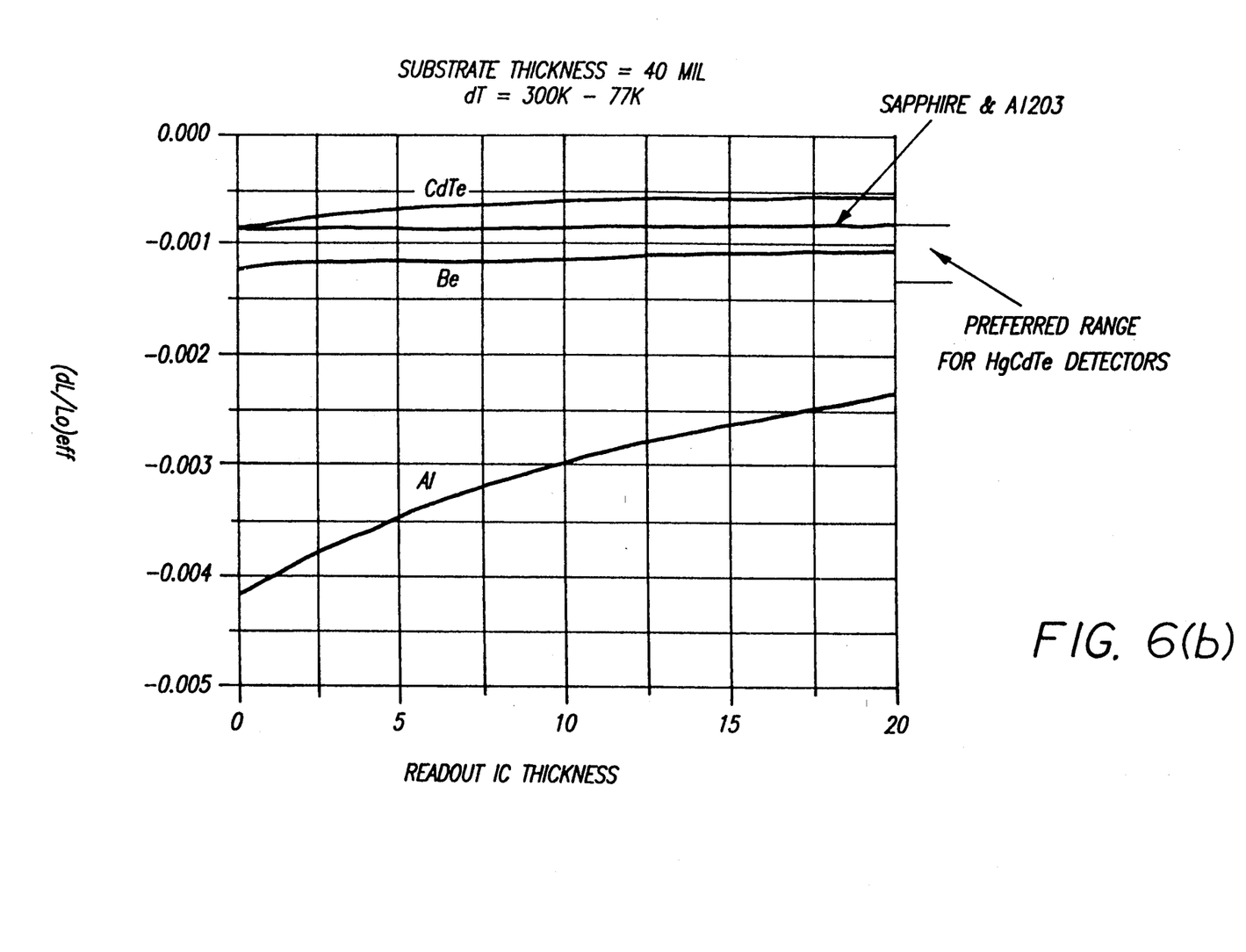

FIG. 6 is identical to FIG. 5 with the exception that the substrate thickness is 40 mil. FIG. 6 thus indicates the effect of increased substrate thickness on the coefficient of thermal expansion of the composite structure.

Figure 7:
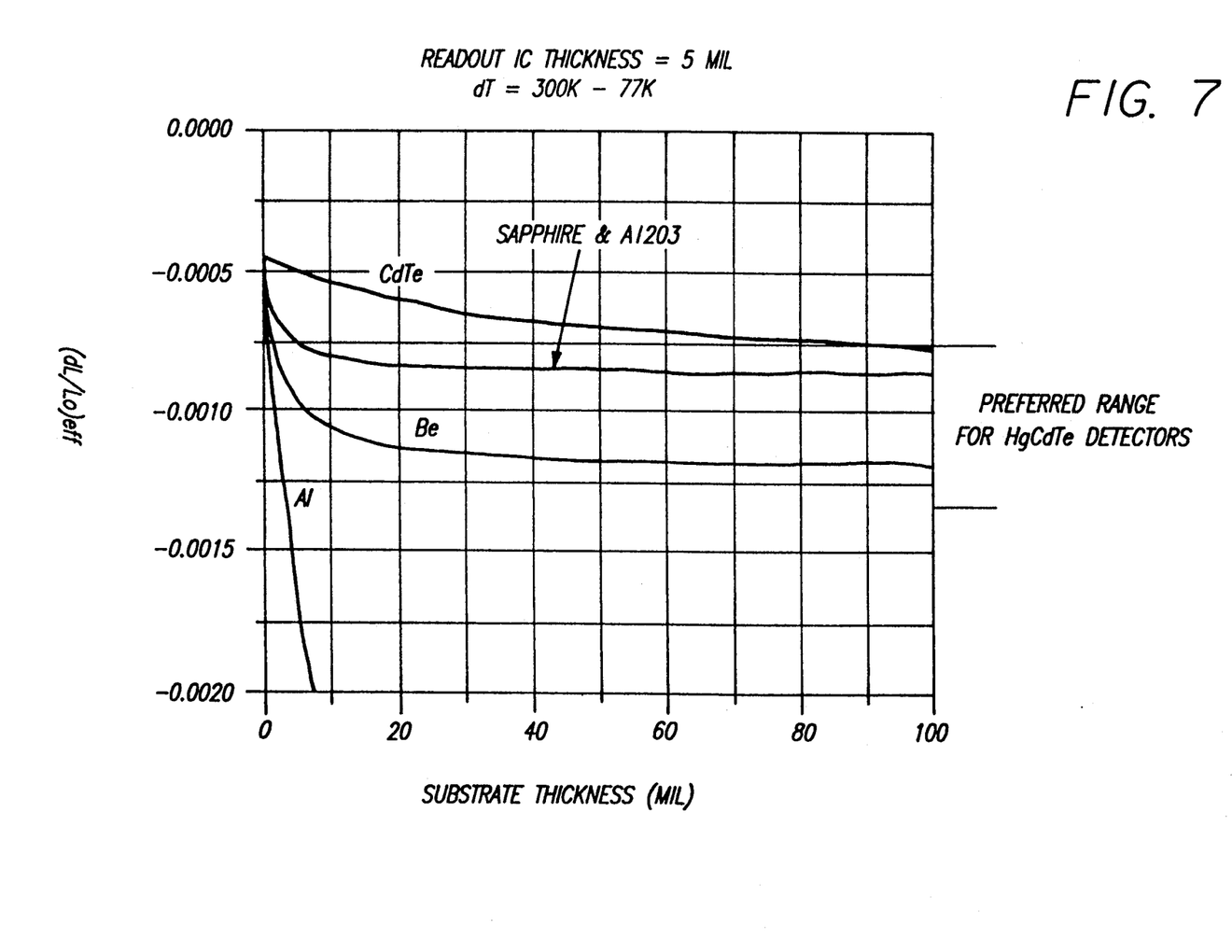
FIG. 7 is a graph illustrating the relationship between substrate thickness and thermal coefficient of expansion for a readout circuit/substrate composite for a substrate thickness of 5 mil.

FIG. 7 is a plot of $(\delta L/L_0)_{eff}$ as a function of substrate thickness for a silicon readout IC thickness of 5 mil.

The theoretical relationship between readout IC thickness, substrate thickness and coefficient of thermal expansion of the readout/substrate composite structure set out in the above equations and graphically shown in FIGS. 5-7 indicates that virtually any desired coefficient of thermal expansion can be achieved.

For currently preferred detector materials such as HgCdTe and InSb, the ability to create composites of matching coefficient thermal expansion has been confirmed by testing. Also, the ability to make widely varying thermal coefficient composite structures has also been confirmed. Exemplary experimental data is illustrated in Table 1.

TABLE 1

| Substrate Material | Substrate Thickness (MIL) | Readout IC Thickness (MIL) | ΔL/L (PPM) Composite |
|---|---|---|---|
| SI | | | 377 |
| Free SI Readout IC | | | 448 |
| Alumina | | 20 | 461 |
| Stainless Steel (SS) Alloy 304 | 44 | 19 | 462 |
| Iron/Nickel Alloy (39) | 41 | 18.5 | 495 |
| Aluminum (Al) | | 20 | 576 |
| SS 304 | 41.8 | 19.2 | 599 |
| Sapphire | 40 | 5 | 694 |
| Al₂O₃ | 40 | 5 | 775 |
| Alumina | | | 869 |
| Sapphire | | | 877 |
| HgCdTe | | | 942 |
| InSb | | | 1042 |
| SS 304 | 38.9 | 13.7 | 1083 |
| SS 303 | 60 | 19 | 1100 |
| SS 303 | 60 | 20 | 1131 |
| Al | | 5.2 | 2446 |
| SS 410 (annealed) | 32.7 | 9.8 | 1173 |
| SS 410 | 32.8 | 10.45 | 1032 |
| Iron/Nickel Alloy 39 | | | 849 |
| SS410 | | | 1764 |
| SS410 (annealed) | | | 1721 |
| BeO | | | 1398 |

Figure 8:
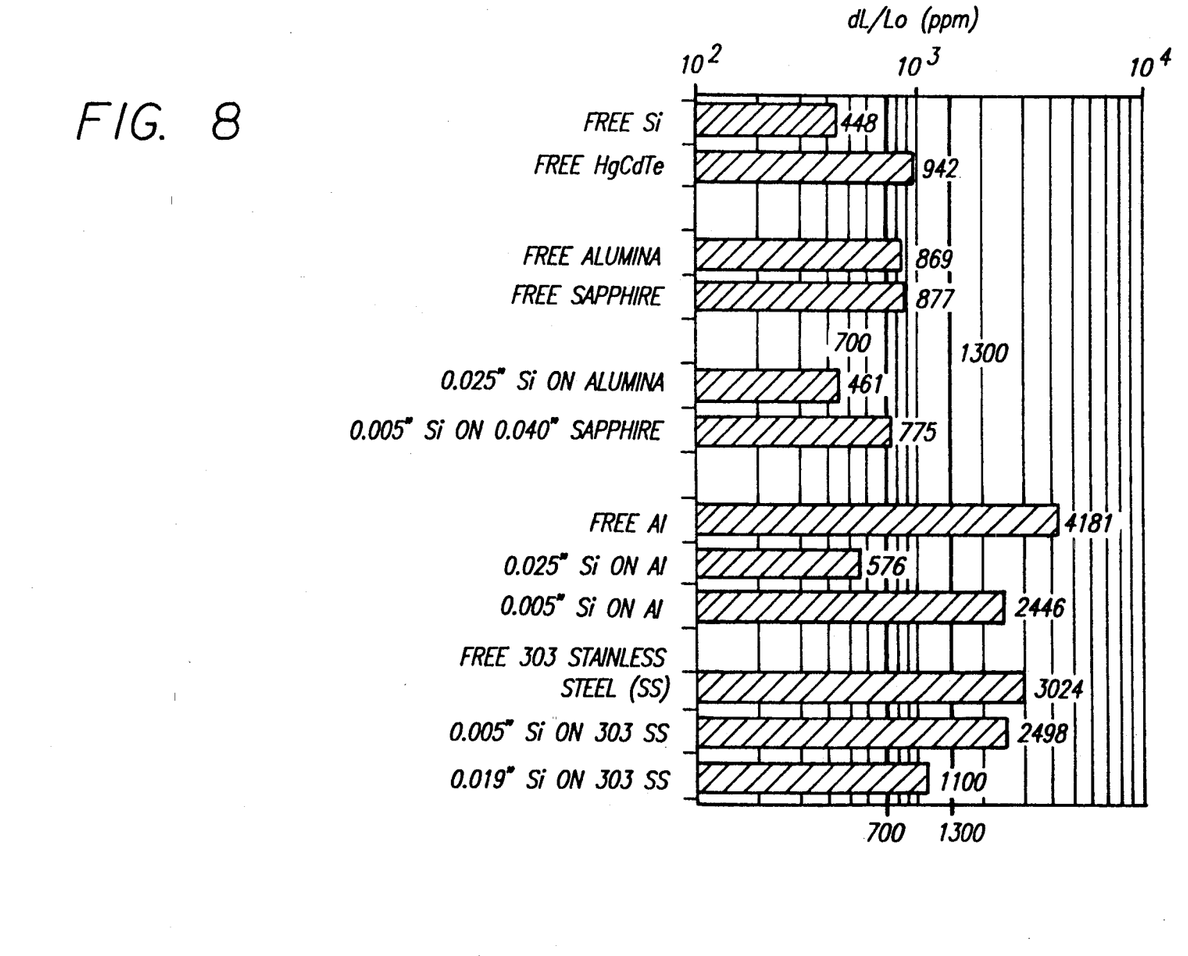
FIG. 8 is a graph illustrating experimental data for specific readout circuit/substrate composites.

As will be appreciated from inspection of Table 1, several readout/substrate combinations provide very good thermal coefficient matches with the detector materials HgCdTe and InSb. In particular, values of ΔL/L of between 700 and 1300 PPM for the composite readout/readout substrate will sufficiently approximate the ΔL/L of HgCdTe detector material of 942 PPM to significantly reduce or eliminate the thermal mismatch problem. Some of the data from Table 1 is also illustrated graphically in FIG. 8, with a range of acceptable ΔL/L₀ values for matching HgCdTe detectors illustrated by the vertical two lines at 700 and 1300.

The following are thus presently preferred readout/substrate detector combinations:

| Readout IC | Readout IC Thickness ($\tau_m$) | Substrate Material | Substrate Thickness ($\tau_s$) |
|---|---|---|---|
| Si | 1–10 mil | Sapphire | 15–40 mil |
| Si | 1–10 mil | Al₂O₃ (Alumina) | 15–40 mil |
| Si | 1–10 mil | BeO (Beryllia) | 15–40 mil |
| Si | ~15–20 mil | 300 series Stainless Steel | 30–60 mil |
| Si | ~5–15 mil | 400 series Stainless Steel | 20–40 mil |
| Si | 1–10 mil | FeNi (Alloy 42) | >10 mil |
| Si | 1–10 mil | FeNi (Alloy 39) | >10 mil |
| Si | 5–15 mil | Be | >15 mil |

Figure 9A:
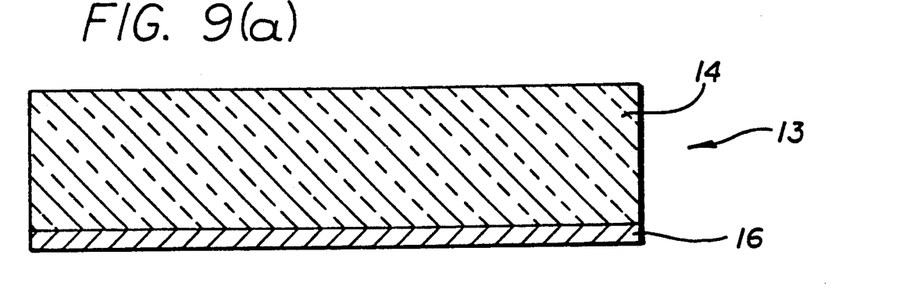
FIGS. 9(a), 9(b), 9(c), 9(d) and 9(e) are drawings illustrating a method of manufacture of the hybrid detector of the present invention.

Referring to FIGS. 9(a)-9(e), a preferred method of fabrication of the hybrid infrared detector of the present invention is illustrated. As shown in FIG. 9(a), the method of the present invention may commence with a conventional detector array portion 13. Detector array portion 13 may preferably employ a HgCdTe active layer 16, of a thickness of approximately 1 mil (2582 ), expitaxially formed on an infrared transparent CdTe substrate 14. For ease of manufacturing and handling, the CdTe substrate 14 may be of a conventional thickness of approximately 35 mils. Active layer 16 may be formed on substrate 14 through any suitable epitaxial growth technique, for example, liquid phase epitaxy, with a stoichiometry chosen for the wavelength of infrared radiation to be detected; i.e., formed with a chemical composition $Hg_{1-x}Cd_xTe$, where x may vary from 0 to 1 to thereby adjust the bandgap of the material and hence the infrared detection wavelength sensitivity. As the detector array 13 is completely conventional to this point, it will be appreciated by those skilled in the art that other substrates may also be employed instead of CdTe, having suitably transparent characteristics to the infrared wavelength to be detected. For example, a substrate of CdZnTe or CdSeTe may equally be employed. Furthermore, other active layers may also be employed, including, for example, Ge, InSb, AlGaAs, and super-lattice structures formed by molecular epitaxy techniques on the substrate 14.

Figure 9B:
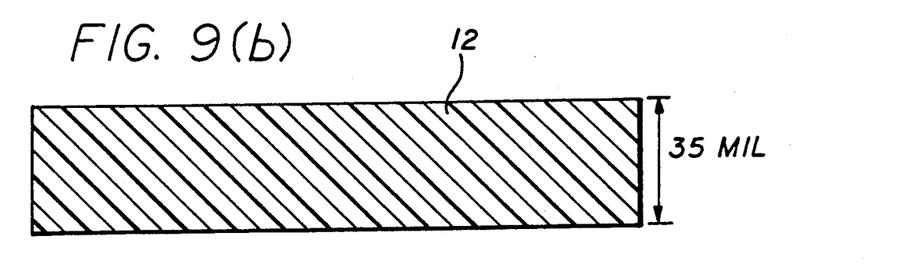

Referring to FIG. 9(b), the silicon readout circuitry 12 is illustrated prior to bonding to the readout substrate. At this point it is completely conventional, having a desired readout circuit formed through conventional integrated circuit techniques on the upper surface of a wafer of which only a portion is shown for convenience of illustration.

Figure 9C:
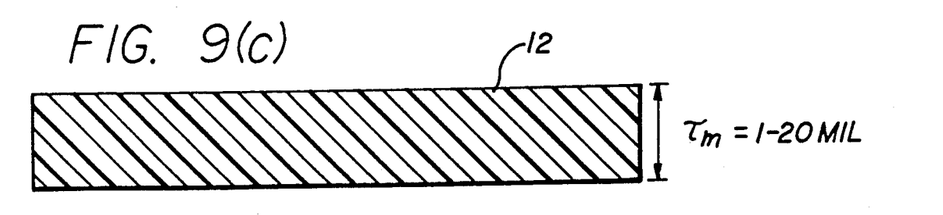

Referring to FIG. 9(c), the wafer of readout ICs is illustrated after it has been thinned to a desired thickness from the approximately 35 mil thickness illustrated in FIG. 9(b). As discussed above, the thickness $\tau_m$ will be chosen to achieve the desired reliability for a specified hybrid size, generally in accordance with the relations illustrated in FIG. 4. Thinning from the 35 mil conventional thickness to the substantially reduced thickness $\tau_m = 1-20$ mil may be done using well known lapping and polishing techniques. Preferably, a first lapping step will reduce the wafer of readout ICs 12 to approximately the desired thickness $\tau_m$, and is followed by a more accurate polishing step to provide an even surface for bonding to substrate 11 and a precise tolerance for the thickness $\tau_m$ across the wafer. Alternatively, diamond turning or laser thinning methods may be employed to thin the wafer of readout ICs 12 to the desired thickness. Alternatively, the thinning step may be done for individual readout ICs after dicing into individual ICs, rather than for an entire wafer.

Figure 9D:
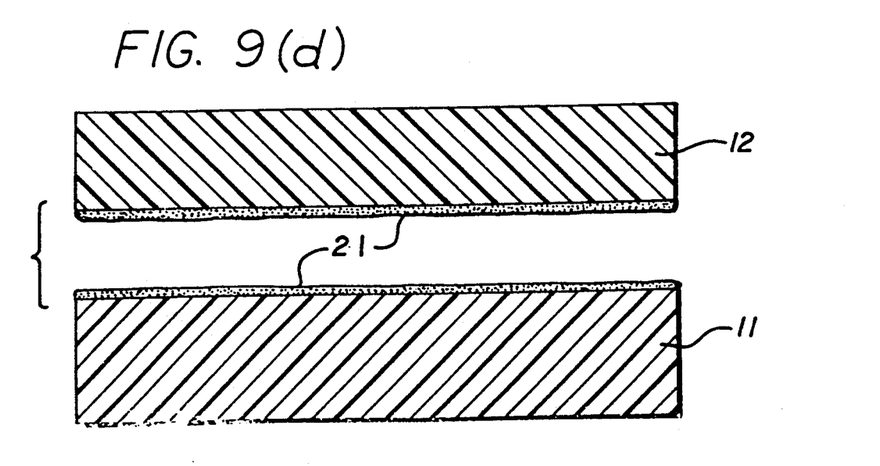

Referring to FIG. 9(d), the wafer of readout ICs 12 is illustrated being bonded to readout substrate 11. In this bonding step, it is desired to form a composite structure with a well defined thermal coefficient of expansion. Accordingly, a rigid bonding material, such as an epoxy glue 21, is preferably employed to form a rigid composite structure.

Figure 9E:
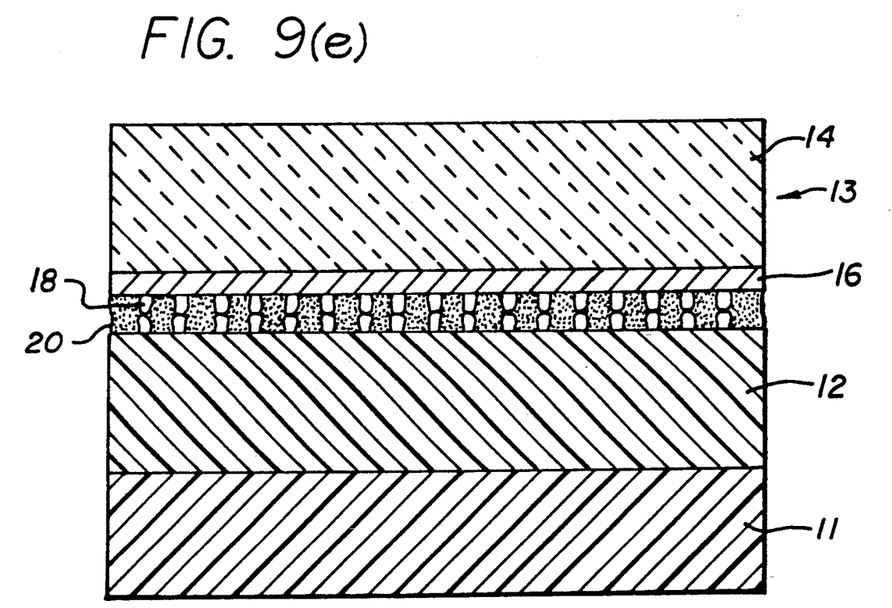

Referring to FIG. 9(e), the hybrid infrared detector array is shown after the detector portion 13 and silicon readout circuit/readout substrate composite have been indium bump bonded together. Also as shown in FIG. 9(e), an additional epoxy bonding material 20 has been back-filled into the space between detector array portion 13 and silicon readout chip 12 to further increase the bonding between the two and thereby strengthen the hybrid.

This step may be done either prior to or after dicing of the wafers containing the readout ICs 12.

Referring to FIGS. 10(a)–10(d), an alternate manufacturing method for the hybrid detector of the present invention is illustrated.

Figure 10A:
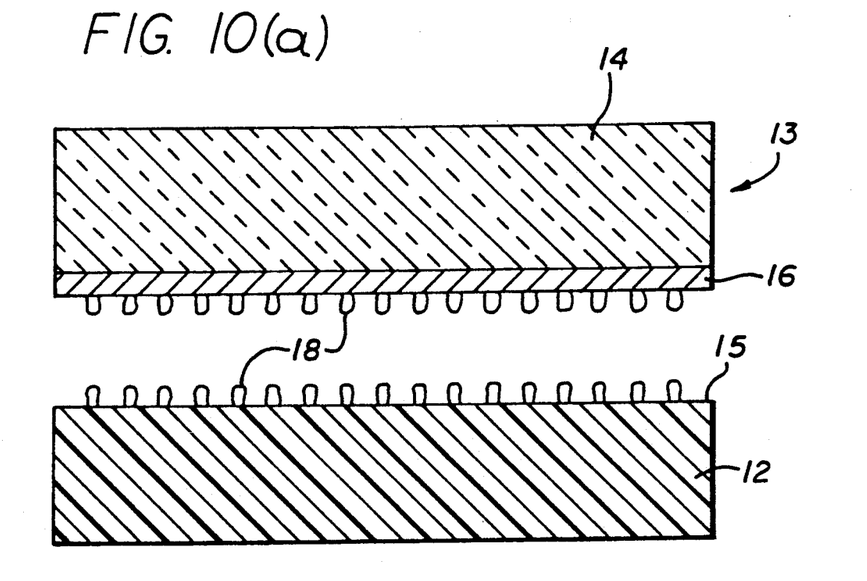
FIGS. 10(a), 10(b), 10(c) and 10(d) are drawings illustrating an alternate method of manufacture of the hybrid detector of the present invention.
Figure 10B:
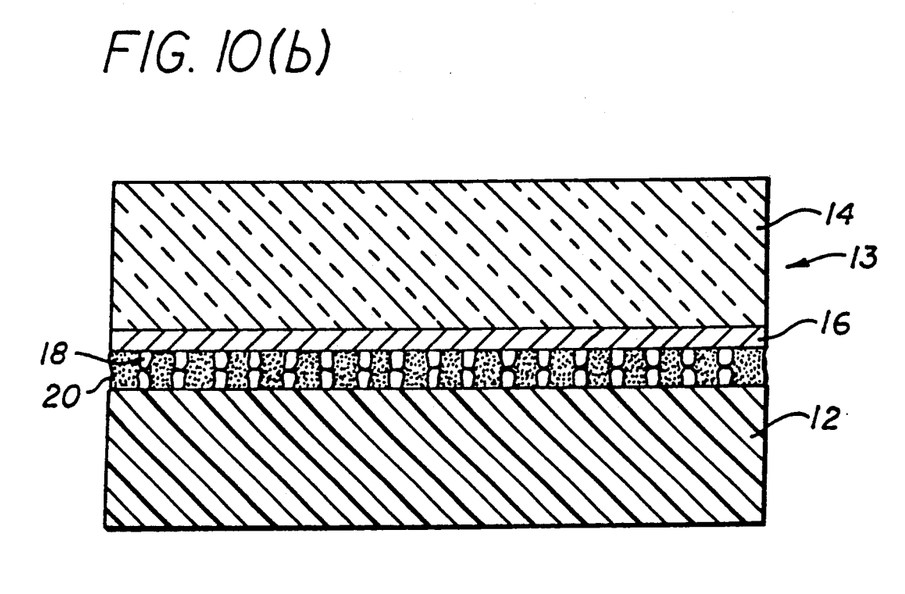
Figure 10C:
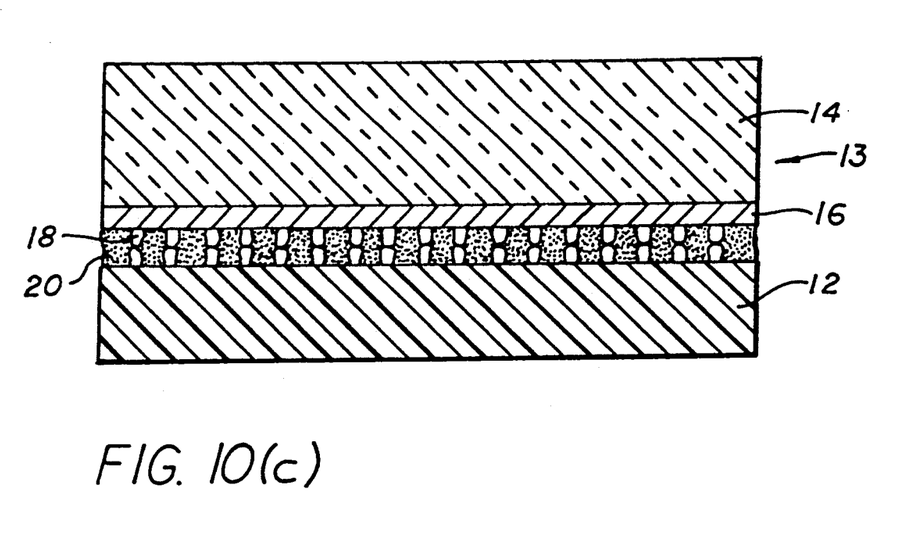

In FIG. 10(a) a conventional detector array portion 13 and readout circuit 12 are shown immediately prior to a conventional indium bump bonding step and after such bonding and backfill with epoxy 20, in FIG. 10(b). After such conventional steps, the bonded detector/readout composite is subjected to a thinning step to thin readout circuit 12 as shown in FIG. 10(c). This thinning step may employ the above-described lapping and polishing or other noted thinning techniques.

Figure 10D:
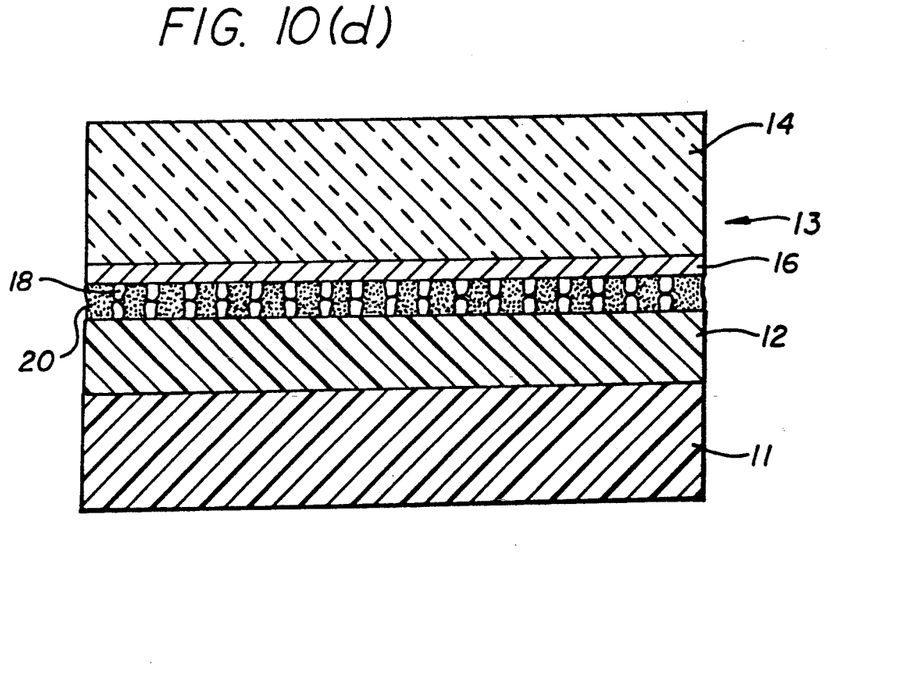

Finally, as illustrated in FIG. 10(d), the readout substrate 11 is rigidly bonded to the bottom major surface of the thinned readout IC 12.

Accordingly, it will be appreciated that the method of fabrication of the improved hybrid detector array of the present invention involves only conventional manufacturing techniques, and only adds an additional thinning step and bonding step to a conventional hybrid manufacturing process. Furthermore, since the epoxy bonding material may be employed with the present invention without sacrificing the thermal reliability characteristics of the hybrid, the hybrid will retain good strength and resistance to vibration and G forces.

Figure 11:
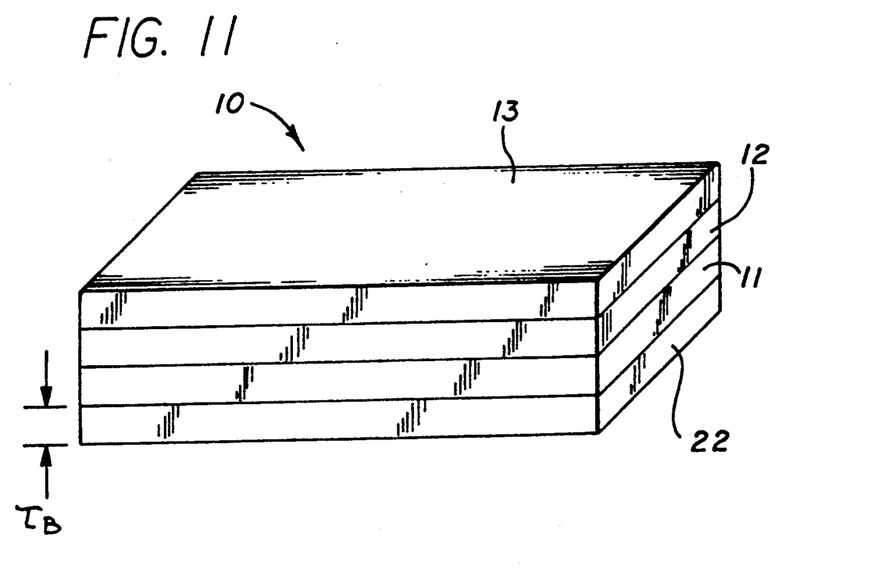
FIG. 11 is a perspective view of an alternate embodiment of the hybrid detector of the present invention.

Referring to FIG. 11, an alternate embodiment of the hybrid detector 10 of the present invention is illustrated. The embodiment of FIG. 11 employs an additional substrate backing 22 which is rigidly bonded to the readout substrate 11 on the bottom surface thereof, opposite readout circuit 12. Substrate backing 22 is provided to reduce or eliminate the tendency of the composite readout/readout substrate structure to "bow", i.e. bend slightly in a manner analagous to a bimetallic strip, when the temperature changes significantly, e.g., from room temperature to cryogenic temperatures. Although such bowing will be negligible for thinner readout circuits 12, for readouts closer to the 20 mil thickness range some undesirable bowing may occur. The addition of substrate backing 22 makes the composite structure more symmetric thereby reducing or eliminating bowing.

The substrate backing has a thickness ($\tau_B$) and a composition which may both correspond to that of readout circuit 12, creating a symmetric composite structure. For example, for a readout circuit 12 composed of Si, 5 mil thick, mounted on substrate 11 of sapphire 40 mil thick, backing 22 would be preferably a Si slab 5 mil thick.

Alternatively, substrate backing 22 may have a different composition and thickness than the readout circuit but nonetheless compensate for readout circuit bowing in the readout/readout substrate composite. More specifically, the bowing compensation provided by backing 22 will depend on its Young's Modulus, coefficient of thermal expansion and $\tau_B$, and these parameters may be chosen to offset the bowing of the composite readout/readout substrate structure, to result in the equivalent of a physically symmetric backing.

Accordingly, it will be appreciated that the infrared hybrid focal plane array of the present invention and method of making the same provides a hybrid array with a significantly reduced susceptibility to thermal mismatch problems resulting from cooling the hybrid from room temperature to cryogenic temperatures. Such reduction in susceptibility to thermal mismatch problems allows hybrids of practically unlimited size to be fabricated, with such size limitations only coming from the fabrication process limitations resulting from non-thermal mismatch effects. Furthermore, the performance of the hybrid infrared detector of the present invention is not compromised with respect to the conventional hybrid detectors as opposed to alternate approaches employing alternate, less desirable infrared detector substrates, since conventional detector substrates and active device layers may be employed. Furthermore, the present invention allows the use of an epoxy bonding interface between the detector array portion and readout circuit, resulting in a strong hybrid, resistant to detrimental effects of handling, vibration and high G force environments, encountered in many applications. Furthermore, the method of the present invention employs preexisting well known fabrication techniques and does not require any complex processing steps to be introduced into the hybrid manufacturing process.

While the foregoing description of the preferred embodiments have been described for presently preferred materials and geometries, it will be readily appreciated by those skilled in the art that the present invention is equally compatible with a variety of different materials, different readout circuits, different readout substrates and different geometries of the hybrid. Furthermore, the process of fabricating the hybrid detector of the present invention may be also varied to take advantage of various processing techniques well known to those skilled in the art. Accordingly, the present invention should not be limited to the preferred embodiment described above.

What is claimed is:

1. A hybrid infrared detector array, comprising:
   a readout circuit substrate, having an upper major surface;

a readout circuit chip rigidly bonded to the upper major surface of the readout circuit substrate so as to form a composite structure therewith; and an infrared detector array portion including an active infrared detector layer formed on a transparent infrared substrate, said detector array portion being bonded to and electrically connected with, said readout circuit;

wherein the thermal coefficient of expansion of said composite structure is substantially the same as said detector array portion.

2. A hybrid infrared detector array as set out in claim 1, wherein said readout circuit chip is composed of silicon, said transparent infrared substrate is composed of a material selected from the group consisting of CdTe, CdZnTe, and CdSeTe, and wherein said active infrared detection layer is composed of HgCdTe.

3. A hybrid infrared detector array as set out in claim 1, wherein the readout circuit substrate is 20-40 mils in thickness.

4. A hybrid infrared detector array as set out in claim 1, wherein said readout circuit has a thickness between 1-20 mils.

5. A hybrid infrared detector array as set out in claim 1, wherein said detector array portion and said silicon readout circuit are bonded together through indium electrical connection bonding bumps a epoxy bonding material interspersed between said indium bonding bumps.

6. A hybrid infrared detector array as set out in claim 1, wherein said readout circuit substrate is composed of a material selected from the group consisting of stainless steel, aluminum, sapphire, alumina, berrylia, and iron/nickel alloy.

7. A hybrid infrared detector array as set out in claim 1, wherein said readout circuit chip is composed of silicon and a material having a coefficient of thermal expansion substantially the same as, or greater than, said infrared detector array portion.

8. A hybrid infrared detector comprising:

a detector composite structure comprising an active infrared detection layer formed on an infrared transparent substrate, said detector composite structure having a first coefficient of thermal expansion; and a readout composite structure bonded to said detector composite structure, comprising a readout circuit formed as an integrated circuit chip and a readout substrate rigidly bonded to said integrated circuit chip, said integrated circuit chip having a thickness less than or equal to said readout substrate, said readout composite structure having a second coefficient of thermal expansion approximately equal to said first coefficient of thermal expansion.

9. A hybrid infrared detector as set out in claim 8, wherein said integrated circuit chip is composed of Si and has a thickness of from 1-10 mil and wherein said readout substrate has a thickness of from 15-40 mils and is composed of a material selected from the group consisting of sapphire, Al$_2$O$_3$, and BeO.

10. A hybrid infrared detector as set out in claim 8, wherein said integrated circuit chip is composed of Si and has a thickness of from 5-20 mils and wherein said readout substrate has a thickness of from 20-60 mils and is composed of stainless steel.

11. A hybrid detector as set out in claim 8, wherein said integrated circuit chip is composed of Si and has a thickness of from 1-10 mils and wherein said readout substrate is composed of an iron/nickel alloy and has a thickness of greater than 10 mils.

12. A hybrid detector as set out in claim 8, wherein said integrated circuit chip is composed of Si and has a thickness of from about 5-20 mils and wherein said readout substrate is composed of Be and has a thickness of greater than 15 mils.

13. A hybrid detector as set out in claim 8, wherein said readout composite structure further comprises a substrate backing rigidly bonded to said readout substrate on the side opposite to said integrated circuit chip.

14. A hybrid detector as set out in claim 13, wherein said integrated circuit chip is composed of Si and said substrate backing is composed of Si and has approximately the same thickness as said integrated circuit chip.

15. A method for forming a hybrid infrared detector, comprising the steps of:

providing an infrared readout circuit formed in a semiconductor integrated circuit chip;

mounting an infrared detector to the readout circuit, said infrared detector having an active infrared detection layer formed on an infrared transparent substrate;

thinning the readout circuit to a thickness of from 1-20 mils; and rigidly bonding the thinned readout circuit to a readout substrate.

16. A method for forming an hybrid infrared detector as set out in claim 15, wherein said step of thinning comprises lapping the readout circuit to approximately the desired thickness followed by polishing to the desired thickness.

17. A method as set out in claim 15, wherein said infrared detector transparent substrate is composed of a material selected from the group consisting of CdTe, CdZnTe, and CdSeTe and wherein said infrared detector active layer is composed of HgCdTe.

18. A method as set out in claim 15, wherein said readout substrate has a thickness of approximately 20-40 mils.

19. A method as set out in claim 15, wherein said step of thinning the readout circuit comprises employing diamond turning the readout circuit to a desired thickness.

20. A method as set out in claim 15, wherein said step of thinning the readout circuit comprises employing laser thinning the readout circuit to a desired thickness.

21. A method as set out in claim 15, wherein said infrared transparent substrate is a compound semiconductor material with one or more component compounds selected from the group consisting of Zn, Cd or Hg in combination with Te or Se.

22. A method as set out in claim 15, wherein said active infrared detection layer is a compound semiconductor material with one or more component compounds selected from the group consisting of Zn, Cd or Hg in combination with Te or Se.

23. A method as set out in claim 22, wherein said infrared transparent substrate is composed of CdSeTe and said active infrared detection layer is composed of HgZnTe.

24. A method as set out in claim 15, further comprising the step of rigidly bonding a substrate backing to said readout substrate on a side thereof opposite to said readout circuit.

25. A method as set out in claim 24, wherein said readout circuit is composed of Si, and said substrate backing is composed of Si.

* * * * *